United States Patent
Kumaus et al.

(10) Patent No.: US 7,727,815 B2
(45) Date of Patent: Jun. 1, 2010

(54) REACTIVE GETTERING IN PHASE CHANGE SOLDERS TO INHIBIT OXIDATION AT CONTACT SURFACES

(75) Inventors: Chad A. Kumaus, Chandler, AZ (US); Carl Deppisch, Chandler, AZ (US); Daewoong Suh, Phoenix, AZ (US); Ashay A. Dani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 10/954,646

(22) Filed: Sep. 29, 2004

(65) Prior Publication Data

US 2006/0065974 A1    Mar. 30, 2006

(51) Int. Cl.
    *H01L 21/44*    (2006.01)
    *H01L 21/48*    (2006.01)
(52) U.S. Cl. .................... 438/122; 438/118; 257/779; 257/E23.089
(58) Field of Classification Search ............. 438/118, 438/122; 257/779, 712
    See application file for complete search history.

(56) References Cited

U.S. PATENT DOCUMENTS

| | | | |
|---|---|---|---|
| 4,607,277 A * | 8/1986 | Hassan et al. ............ 257/713 |
| 5,170,930 A * | 12/1992 | Dolbear et al. ........... 228/123.1 |
| 5,325,265 A * | 6/1994 | Turlik et al. ............... 361/702 |
| 5,523,260 A * | 6/1996 | Missele ..................... 156/330 |
| 6,656,770 B2 * | 12/2003 | Atwood et al. ............. 438/118 |
| 6,740,544 B2 * | 5/2004 | Strouse et al. ............. 438/118 |
| 2004/0195701 A1 * | 10/2004 | Attarwala ................... 257/783 |
| 2004/0200879 A1 * | 10/2004 | Lewis et al. ................ 228/56.3 |
| 2004/0262745 A1 * | 12/2004 | Cordes et al. .............. 257/713 |

* cited by examiner

*Primary Examiner*—Nitin Parekh
(74) *Attorney, Agent, or Firm*—Schwegman, Lundberg & Woessner, P.A.

(57) ABSTRACT

A method for forming a high thermal conductivity heat sink to IC package interface is disclosed. The method uses reactive getter materials added to a two phase solder system having a phase change temperature that is about the normal operating temperature range of the IC, to bind absorbed and dissolved oxygen in the two phase solder interface material at or near the air to solder surface. Over time this chemical binding action results in an oxide layer at the air to solder surface that slows the rate of oxygen absorption into the solder interface material, and thus reduces the harmful oxidation of the solder to IC package interface and the solder to heat sink interface.

15 Claims, 4 Drawing Sheets

REACTIVE GETTERING IN PHASE CHANGE SOLDERS TO INHIBIT OXIDATION AT CONTACT SURFACES

TECHNICAL FIELD

Various embodiments described herein relate generally to attaching thermal management devices such as heat spreaders or heat sinks to heat producing devices, and more specifically to heat sinks used in conjunction with electronic devices such as integrated circuits ("ICs").

BACKGROUND INFORMATION

Many electronic devices have operational speed requirements that may result in heat dissipation levels that can not be conducted away from the electronic device fast enough to prevent device failure or reduction in operating lifetime. It is known to use heat sinks, heat pipes and integrated heat spreaders on high powered electronic devices such as microprocessors, to improve the rate of thermal conduction away from the device.

The maximum rate at which heat may be conducted away from electronic devices depends in part upon the thermal conductivity of the various materials situated between the heat generator, for example the junction of an IC, and the air or liquid material that will carry the heat away from the electronic device. In an IC these materials may include the die attach material connecting the IC to the package, the package material itself (for example multiple ceramic layers in a hermetic package), the interface material between the package surface and the heat sink (for example a silver filled epoxy or a solder), and the metal of the heat sink itself. These materials must be designed for multiple requirements, only one of which is thermal conductivity.

In general, metallic compounds tend to have relatively high thermal conductivity as compared to organic compounds such as epoxy, and may be used to make thermally conductive joints between a heat-producer and a heat-dissipater. Examples include using a solder to physically and thermally attach an IC to the inside cavity of a circuit package, or to physically and thermally attach a heat sink to the outer surface of a circuit package. One issue with the use of metals such as solders in making physical attachments may be the thermal coefficient of expansion ("TCE") difference between the two devices, such as an IC package, and an aluminum heat sink. The TCE mismatch may occur during heating and cooling phases of device operation. This TCE difference may cause stress on the attachment area of the heat sink to the IC package, and may cause device failure or reduced operational lifetime. As a result of the TCE mismatch issue, it is known to use a local point of physical attachment, such as a screw or metal clip, to provide the majority of physical attachment between a heat sink and an IC package, and to provide a flexible thermal interface material ("TIM") between the heat sink and the IC package to improve the thermal attachment conductivity.

Another issue with the use of metals such as solder in making either physical or thermal attachments may be the tendency of metals to oxidize and form thermally and electrically insulating layers. These insulating oxide layers may be an issue particularly at the surface of an IC package and at the surface of the heat sink. Such oxidation may result in crack formation in the body of the solder, and separation of the metal attachment from the IC package surface, resulting in device failure. Thus there is a need in the art for a thermally conductive thermal interface material that reduces the stress due to TCE mismatch and reduces the oxidation of the IC package to attachment interface.

DETAILED DESCRIPTION

Figure 1:
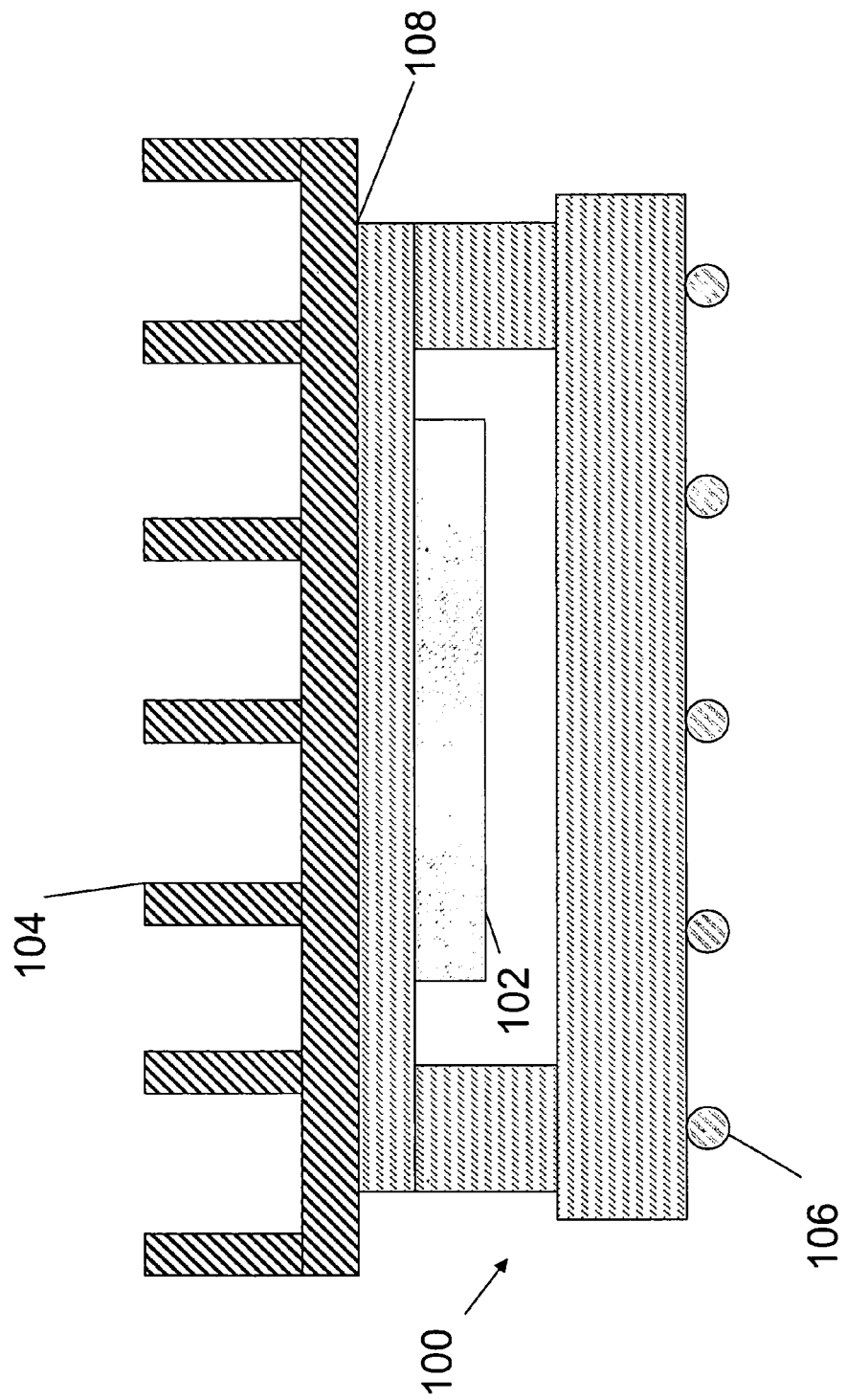
FIG. 1 is a side view of an exemplary embodiment.

In the following detailed description of embodiments of the inventive subject matter, reference is made to the accompanying figures which form a part thereof, and in which is shown by way of illustration, specific preferred embodiments of ways in which the inventive subject matter may be practiced. These embodiments are described in sufficient detail to enable those skilled in the art to practice the inventive subject matter, and it is to be understood that other embodiments may be utilized, and that mechanical, compositional, structural, electrical, and procedural changes may be made to the embodiments disclosed herein without departing from the scope, spirit and principles of the present inventive subject matter. The following detailed description is, therefore, not to be taken in a limiting sense, and the scope of the inventive subject matter is defined only by the appended claims. In the drawings, like numerals describe substantially similar components.

The terms "high" and "low" as used herein for thermal conductivity, refers to comparative values in the ability of a given cross sectional area of a particular material to conduct heat. The value of "high" thermal conductivity will vary depending upon various factors in the particular system in which this disclosure is practiced, such as the number of interfaces and the thicknesses of the materials, and other such differences. A "high" thermal conductivity material used in a TIM, is relative to other materials commonly used in this sort of structure, such as metal filled epoxy. The term "reactive" as used herein for chemicals or elements added to a solder composition, refers to materials having a relatively strong chemical affinity to a particular material as compared to the other materials found in the solder, the IC package, or the heat sink. The term "getter" as used herein for reactive materials added to a solder composition, refers to a material or a state that attracts and essentially permanently binds some particular group of unwanted materials to a location where the unwanted material will not cause as much damage as compared to the situation without having the getter present.

FIG. 1, is a side view of an exemplary embodiment. In FIG. 1 an IC 102 is attached inside an electronic package 100, having a unidirectional heat sink 104. A unidirectional heat sink 104 is used in this illustrative embodiment, but one of skill would understand that any heat spreading device, such as a heat pipe, an omni directional heat sink, or a heat spreader, may be substituted. The IC 102 is attached to the package 100 in an upside down position on the top side of an internal hermetic cavity of the package 100, on the side opposite to the package ball bond attachments 106, which connect to a printed circuit card, not shown for simplicity. The IC 102 is attached to the top of the cavity in the package 100 in order to reduce the distance that the heat generated by the IC 102 has to flow in order to reach the air surrounding the unidirectional heat sink 104. Reducing the distance that heat has to traverse in various materials may result in a reduction in the overall thermal resistance (i.e., an increase in the thermal conductivity). The IC 102 generates heat as a result of electrical operations, and the heat flows through a thin die attach material (not shown) from the IC 102 to the top portion of the package 100. The heat then flows through the thickness of the top portion of the package 100 to the top surface, and through a very thin heat sink attachment material at the interface location 108, an into the unidirectional heat sink 104, where the large surface to volume ratio transfers the heat efficiently to the surrounding air. In some embodiments the top portion of the package 100 may include a metal integral heat spreader to improve the thermal conductivity of the IC 102 to heat sink 104 thermal path.

The TCE mismatch discussed above may cause mechanical stress at the interface location 108, even though the majority of the physical attachment may be provided by one or more mechanical devices, not shown for simplicity, such as metal clips or screws. This stress is typically due to the greater expansion of the metal heat sink 104 as compared to the slower expansion of the package 100. All of the stress occurs across the very thin interface 108, which consists of two interfaces, one from the package 100 to the interface material, and another from the interface material to the heat sink 104. The interface location 108 will be shown in greater detail in the next two figures. This stress may cause fractures in the package 100, resulting in loss of the hermetic nature of the package and resulting in corrosion of the IC 102. The stress may also cause the interface material 108 to lose its attachment to either the heat sink 104, or the package 100, or to both.

What is needed to reduce the interface stress is an interface material that is able to absorb the stresses associated with the TCE mismatch. A two phase solder having both a liquid component and a solid component at the normal operating temperatures of the IC 102 and heat sink 104 combination will provide an interface that has essentially no stress due to thermal mismatch or mechanical strains. This is due to the semisolid and formable nature of two phase solders. However, an issue exists with the operational lifetime of two phase solders due to the absorption of oxygen from the surrounding air into the solder, and the oxidation of the two interfaces between the interface solder 108 and the heat sink 104 and IC package 100. This oxidation may cause the interface material to crack and detach from either the heat sink or the IC package, and the oxidation may form a thermal resistance barrier that may degrade the overall thermal performance of the IC 102 to heat sink 104 paths.

Figure 2:
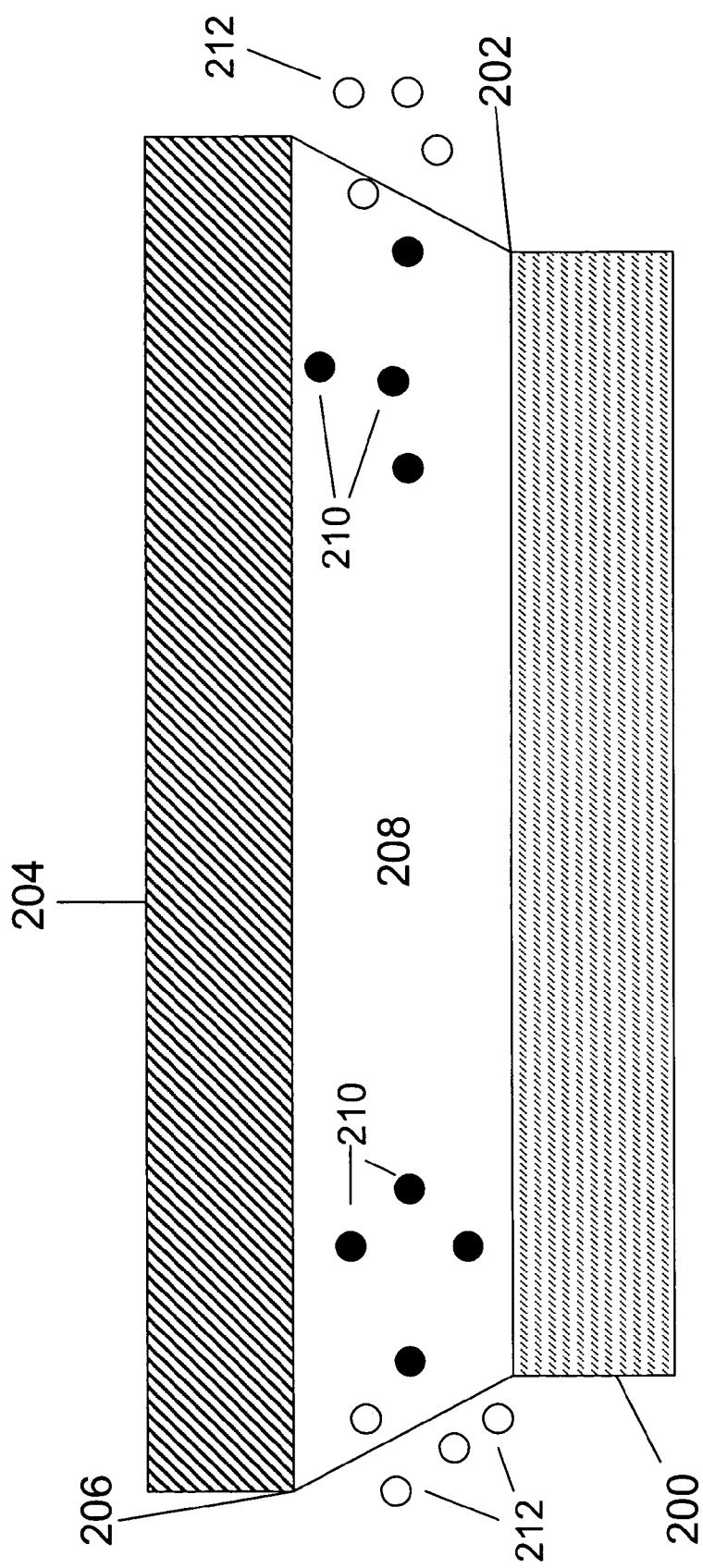
FIG. 2 is an enlarged side view of a portion of FIG. 1.

FIG. 2 is an enlarged side view of a portion of FIG. 1. FIG. 2 shows the top surface of the package 200, which in certain embodiments may be a metal integral heat spreader, and the interface 202 between the top surface of the package 200 and the interface material 208. The interface 206 between the interface material 208 and the lower surface of the heat sink 204 is also shown. Thus the interface 108 of FIG. 1 is shown in greater detail to consist of two interfaces 202 and 206.

The interface material 208 in this illustrative embodiment, comprises a two phase solder material having both liquid and solid portions at the operating temperature range of the IC package 200, and contains a reactive material, which may be known as a getter, shown as dark circles 210. A preferred embodiment uses a solder made of tin indium bismuth type (Sn—In—Bi), or a solder made of indium bismuth (In—Bi). In both illustrative solders the indium is the material most likely to oxidize in the presence of absorbed oxygen in the solder, and may benefit from the use of sacrificial reactive materials added to the solder, known as getters. The getters 210 are typically reactive materials containing P, Zn, Cr, Mn, Mg, V, Nb, Si, Ti, B, Li, Ba, Zr and Th, which have more chemical affinity to oxygen 212, shown as the open circles, than anything else in the interface material 208 system, such as the elements of the solder material 208, or the metal of the heat sink 204, or the package surface 200.

Typically the getter material is selected from those materials lying below indium on an Ellingham diagram if the two phase solder 208 is tin indium bismuth type solder. The Ellingham diagram has plots of Gibbs Free Energy Change for oxidation reactions. Thus elements having plots with lower values of Gibbs Free Energy Change than indium, will preferentially oxidize over the indium in the solder, and thus protect the indium. Other solder metallurgies than those containing Indium may also be protected in a similar fashion by using the Gibbs Free Energy Change to determine which elemental component of the solder is the most likely to be oxidized, and choosing a getter material that has a lower value of Gibbs Free Energy Change, which will produce a more stable oxide. In preferred embodiments the choice of getter material may preferably be titanium, zirconium and magnesium, either alone or in a combination.

FIG. 2 shows the getter atoms 210 predominantly near the surface of the interface material 208 and the surrounding air. The getter atoms will randomly diffuse around all portions of the interface material 208, preferably a Sn—In—Bi two phase solder having a phase change temperature of around 55 degrees Centigrade. The temperature of the phase change may be controlled by the solder composition and may preferably be about the normal operating temperature of the IC contained in the package 200. The getter atoms 210 will diffuse rapidly in liquid portions of the two phase solder 204, and may selectively segregate from the solid portions of the solder into the liquid portions when the solder passes through its phase change temperature and attains its normal operating temperature. The getter atoms 210 will chemically attach to the oxygen 212 absorbed into the surface of the solder interface material 208, and preferably bind them at a location near the surface. The local reduction in the number of getter atoms 210 in the region around the air to solder surface, will be counteracted by continued diffusion of getter atoms from deeper inside the solder interface material 208, until all getter atoms are bonded to the oxygen molecules 212 diffusing into the solder. It is preferable to have enough getter material 210 to bind the oxygen 212 as rapidly as possible after it has absorbed into the surface of the solder interface material 208, to reduce the amount of oxygen that may diffuse deep into the interface material 208 to form an oxide near the interfaces 202 and 206, or at any solid to liquid boundaries found inside the interface material 208.

Figure 3:
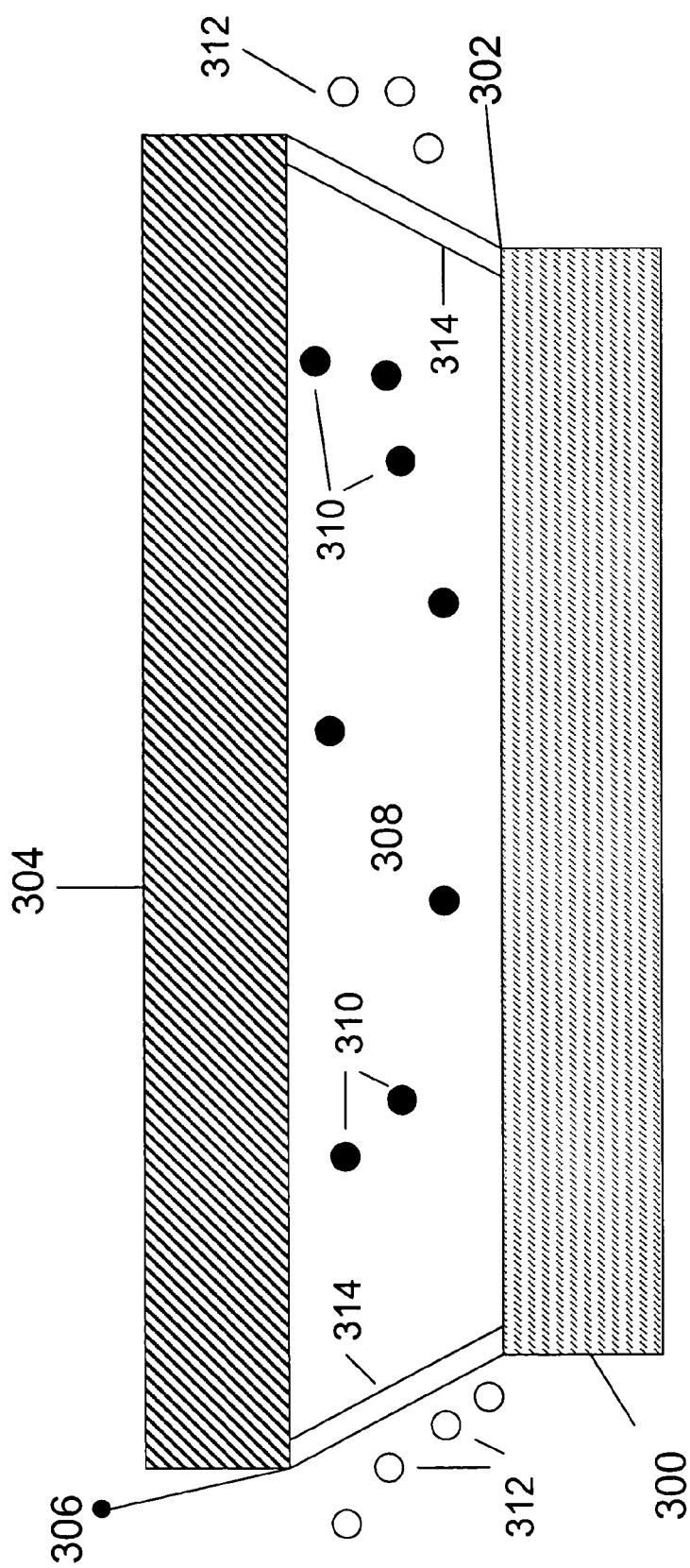
FIG. 3 is another enlarged side view showing another aspect of an exemplary embodiment.

FIG. 3 is another enlarged side view showing another aspect of an exemplary embodiment. FIG. 3 shows a similar magnified side view as that shown in FIG. 2, but at a latter time after the diffusion of oxygen 312 into the solder interface material 308, and after the binding of the oxygen by the getter 310 has continued until a surface oxide 314 has formed at the air solder surfaces. The oxide layer 314 formed by oxidation of the getter 310, may reduce the rate at which the oxygen 312 can dissolve, or be absorbed, into the solder interface material 308. Thus the getter forms a protective layer to reduce, and eventually essentially stop, the unwanted oxidation of the solder, and of the solder to package interface 302, as well as the solder to heat sink interface 306. The number of getters in the solder will preferably be more than enough to form the oxide layers 314 to a thickness sufficient to essentially stop oxygen absorption into the solder 308, but without so much getter 310 remaining in the solder 308 that the solder composition is changed. Too much getter 310 remaining in the solder 308 may cause the solder phase change temperature to vary from the predicted value. With such an arrangement it is possible to use the reactive getter added to a solder thermal interface material to automatically provide an oxidation barrier at the air to solder surface, and thus reduce the rate at which oxygen may damage the thermal interface solder. It should be noted that the shown straight solder to air surface is most likely to be a curved surface due to surface tension and attraction, and is illustrated as being straight for convenience and clarity.

Figure 4:
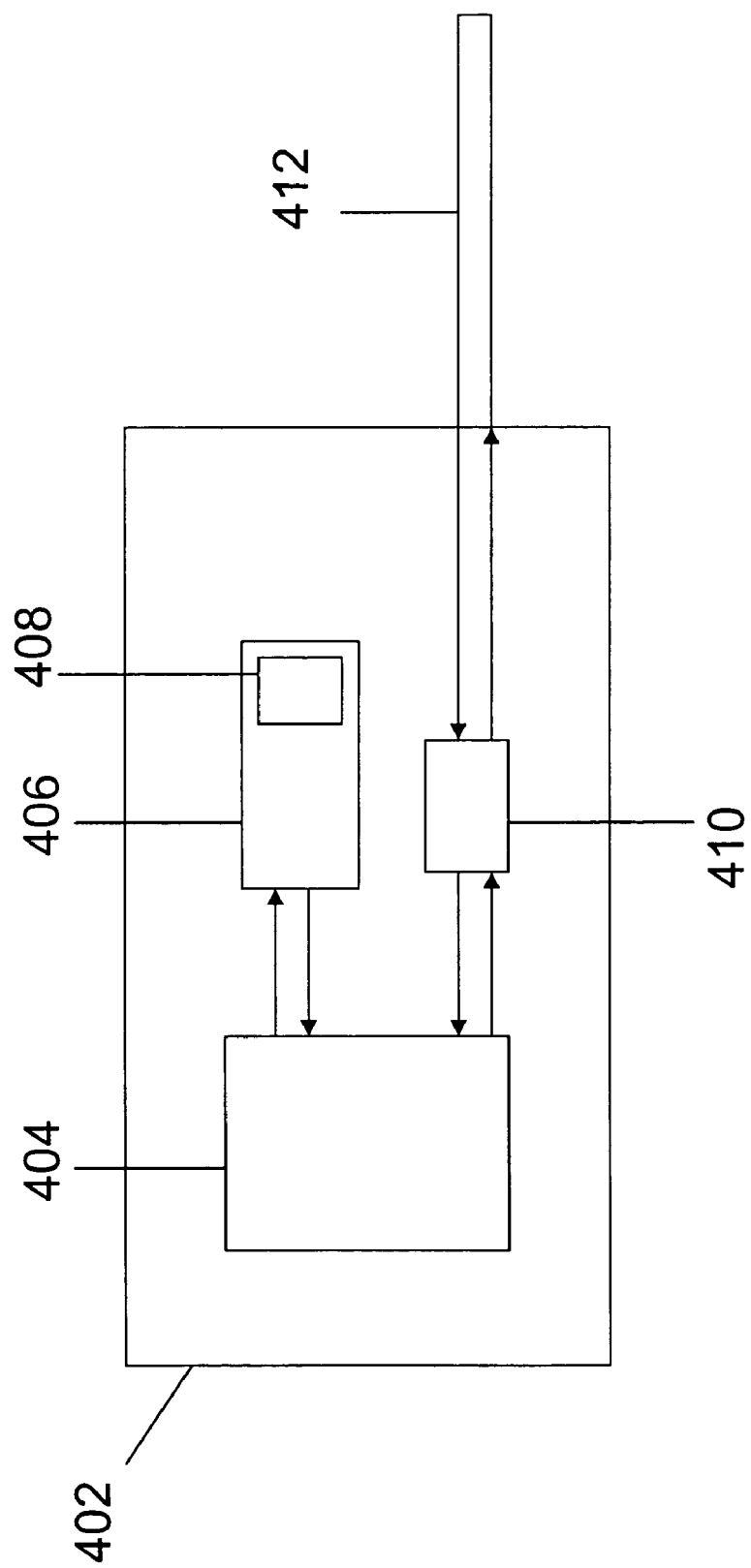
FIG. 4 is a block diagram of a system according to various embodiments of the invention.

FIG. 4 is a block diagram of an article of manufacture 402 according to various embodiments of the invention. The article of manufacture may comprise one or more of a number of possible elements, such as a communications network, a computer, a memory system, a magnetic or optical disk, some other information storage device, and/or any type of electronic device or system. The article 402 may comprise at least one processor 404 coupled to a machine-accessible medium such as a memory 406, storing associated information (e.g., computer program instructions 408, and/or other data), and an input/output driver 410 coupled to external electrical and electronic devices by various elements, such as bus or cable 412, which when accessed, results in a machine performing such actions as calculating a solution to a mathematical problem. Various ones of the elements of the article 402, for example the processor 404, may have need of thermal management methods that may use the present invention to help a heat sink dissipate the excess heat generated by the processor 404, and reducing or preventing the unwanted oxidation of the heat sink to heat generator interface.

Alternatively, the article 402 may comprise a portion or an element of a system, such as a communications network in two-way communications with other elements of the network by means of the bus or cable 412, or by wireless communications elements included in I/O driver 410, or by both cable and wireless elements. In this illustrative example of an element of a system, the two-way communications apparatus may include a coaxial cable, a serial bus, a parallel bus, a twisted pair cable, a dipole antenna, a monopole antenna, a unidirectional antenna, a laser infrared ("IR") diode emitter/detector, or any other suitable type of communication structure. The processor 404 may accept signals from the I/O driver 410 and perform an operation under the control of a program in memory 406, or use local provisioning information source in computer program instruction area 408. The processor 404, or any one of the elements in this illustrative embodiment including a power transformer (not shown), may have over heating issues that may be improved by use of the disclose arrangement wherein any of the elements may have a two phase solder interface with a reactive getter thermally connecting the heat sink to the heat generator.

The accompanying figures that form a part hereof show by way of illustration, and not of limitation, specific embodiments in which the inventive subject matter of the invention may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of the various disclosed embodiments. Combinations of the above embodiments, and other embodiments not specifically described herein, will be apparent to those of skill in the art upon reviewing this description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope of meaning of the claims. In addition, in the foregoing Detailed Description, it may be seen that various features are grouped together in a single embodiment for the purpose of streamlining this disclosure and increasing its clarity. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method comprising:
   physically attaching a first object to a second object with both a physical attachment, and a thermal attachment with an interface material disposed therebetween, wherein;
   the interface material is a two phase material having a first portion in a solid phase and a second portion at least partially in a liquid phase within the entirety of a desired operating temperature range of the first object, and further comprises a component having an affinity for oxygen in the liquid phase of the interface material selected from the list consisting essentially of P, Zn, Cr, Mn, Mg, V, Nb, Ti, B, Li, Ba, Zr and Th.

2. The method of claim 1, further comprising the interface material is a highly thermally conductive material in a solid state at temperatures below the operating temperature range of the first object.

3. The method of claim 2, further the first object comprises a heat generating device.

4. The method of claim 3, further the heat generating device comprises an electronic device.

5. The method of claim 4, further the electronic device comprises an integrated circuit.

6. The method of claim 2, further the second object comprises a thermally conductive structure.

7. The method of claim 6, further comprising the thermally conductive structure has a high surface area to volume ratio.

8. The method of claim 2, further the interface material comprises a composite material with at least one metallic component.

9. The method of claim 8, further the interface material comprises a phase change solder having a phase change temperature point that is less than a normal operating temperature range of the first object.

10. The method of claim 9, further comprising the component having an affinity for oxygen in the solder includes at least one getter having a greater chemical affinity to oxygen than any metallic component of the solder, and the getter moves in the liquid phase to a surface between the solder and surrounding air.

11. The method of claim 10, further comprising the getter selected from those metallic elements lying below indium on an Ellingham diagram.

12. The method of claim 10, further comprising the getter moving to the surface reacts with oxygen absorbed or dissolved into the solder to form an oxide layer on the surface.

13. A method of attaching a heat sink to an electronic device, comprising:
  depositing a two phase solder material having a liquid phase change occurring at essentially the entirety of an operating temperature of the electronic device on a thermally conductive surface of the electronic device, the two phase solder material including a component having an affinity for oxygen when a portion of the two phase solder material is in a liquid phase selected from a list consist essentially of P, Zn, Cr, Mn, Mg, V, Nb, Ti, B, Li, Ba, Zr and Th;
  positioning the heat sink on the solder;
  attaching the heat sink, electronic device and the solder together;
  heating the heat sink, electronic device and the solder to a temperature above the melting point of the solder; and
  cooling the heat sink, electronic device and the solder to a temperature below the melting point of the solder.

14. The method of claim 13, further the electronic device comprises a packaged integrated circuit.

15. The method of claim 13, further the two phase solder material comprises a getter element that has a greater chemical affinity to oxygen than any metallic component of the solder, heat sink or electronic device in contact with the solder.

* * * * *